United States Patent
Okamoto et al.

[11] Patent Number: 5,621,068
[45] Date of Patent: *Apr. 15, 1997

[54] THERMOPLASTIC POLYIMIDE POLYMER; THERMOPLASTIC POLYIMIDE FILM; POLYIMIDE LAMINATE; AND METHOD OF MANUFACTURING THE LAMINATE

[75] Inventors: Yoshifumi Okamoto; Hiroyuki Furutani; Kazuhisa Danno; Junya Ida; Hirosaku Nagano, all of Otsu, Japan

[73] Assignee: Kanegafuchi Kagaku Kogyo Kabushiki Kaisha, Osaka, Japan

[*] Notice: The portion of the term of this patent subsequent to Dec. 16, 2013, has been disclaimed.

[21] Appl. No.: 381,890
[22] PCT Filed: Aug. 3, 1994
[86] PCT No.: PCT/JP94/01286
§ 371 Date: Feb. 22, 1995
§ 102(e) Date: Feb. 22, 1995
[87] PCT Pub. No.: WO95/04100
PCT Pub. Date: Feb. 9, 1995

[30] Foreign Application Priority Data

Aug. 3, 1993 [JP] Japan ................................ 5-212273
Aug. 9, 1993 [JP] Japan ................................ 5-218175
Aug. 31, 1993 [JP] Japan ................................ 5-240677

[51] Int. Cl.$^6$ .................................................. C08G 73/10
[52] U.S. Cl. ........................ 528/353; 528/125; 528/128; 528/170; 528/172; 528/173; 528/185; 528/188; 528/220; 528/229; 528/350; 428/411.1; 428/456; 428/473.5; 428/901; 264/258; 427/372.2; 427/383.1; 427/384
[58] Field of Search .................. 528/353, 125, 528/128, 170, 172, 173, 185, 188, 220, 229, 350; 264/258; 428/411.1, 473.5, 456, 901; 427/372.2, 383.1, 384

[56] References Cited

FOREIGN PATENT DOCUMENTS

| | | |
|---|---|---|
| 1540930 | 10/1968 | France . |
| 43-5911 | 3/1968 | Japan . |
| 51-2798 | 1/1976 | Japan . |
| 63-99282 | 4/1988 | Japan . |
| 63-189490 | 8/1988 | Japan . |
| 4-198208 | 7/1992 | Japan . |
| 4-212206 | 8/1992 | Japan . |
| 4-366131 | 12/1992 | Japan . |
| 5-105850 | 4/1993 | Japan . |
| 5-339374 | 12/1993 | Japan . |

*Primary Examiner*—James J. Seidleck
*Assistant Examiner*—P. Hampton-Hightower
*Attorney, Agent, or Firm*—Armstrong, Westerman, Hattori, McLeland & Naughton

[57] ABSTRACT

A thermoplastic polyimide film comprising a thermoplastic polyimide polymer, a polyimide laminate, respectively being suited for use as cover-lay adhesive agent and a cover-lay film capable of exerting distinguished thermal resistant property, processability and adhesion property useful for the manufacture of flexible printed circuit boards, and yet, suited for use as the adhesive-agent layers of flexible copper-coated laminates and bilateral adhesive sheets; and a method of manufacturing the polyimide laminate. The thermoplastic polyimide polymer represented by the general formula (1) specified below:

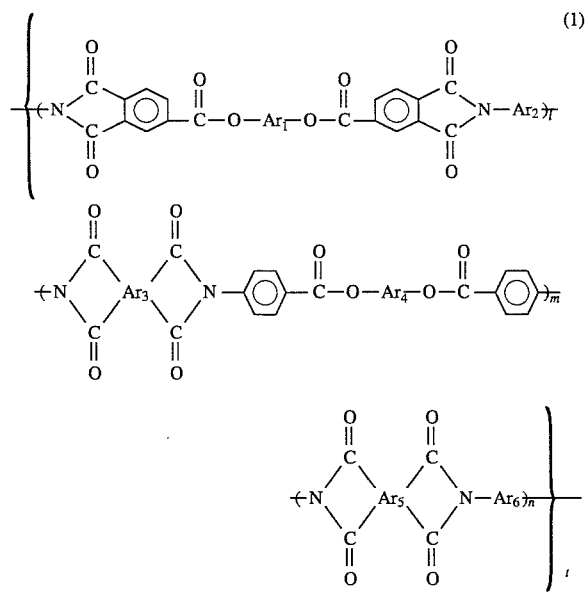

wherein $Ar_1$, $Ar_2$, $Ar_4$ and $Ar_6$, represents divalent organic radical, whereas $Ar_3$ and $Ar_5$ represent quadrivalent organic radical, wherein l, m amd n designate positive integer of 0 to 15, wherein the sum of l and m is 1 or more than 1, and wherein t designates positive integer of 1 or more than 1.

12 Claims, 2 Drawing Sheets

Fig. 1(a)
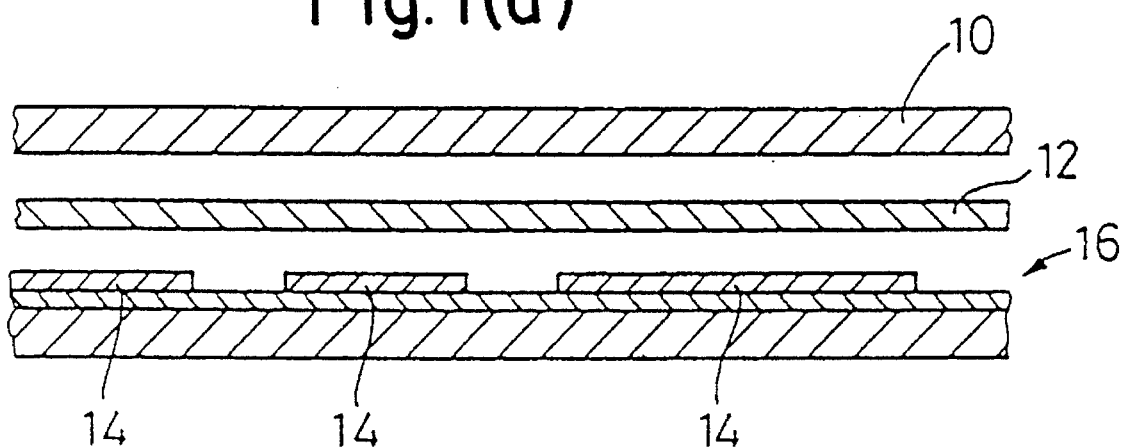
Fig. 1(b)
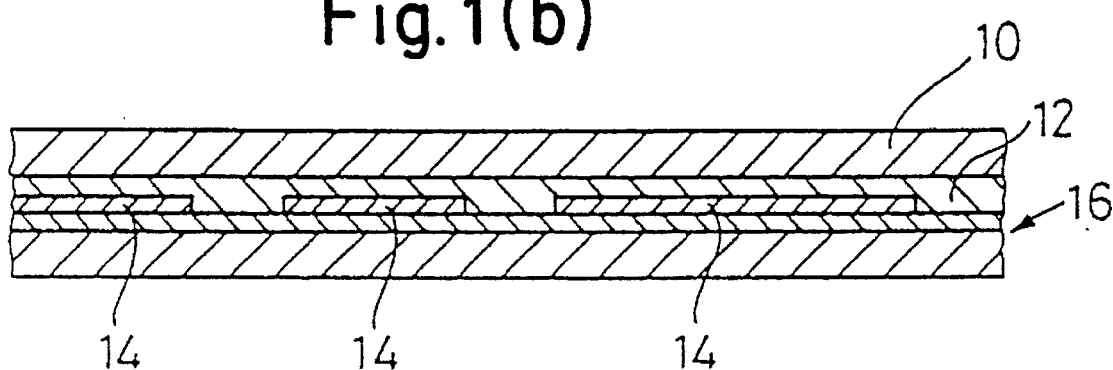
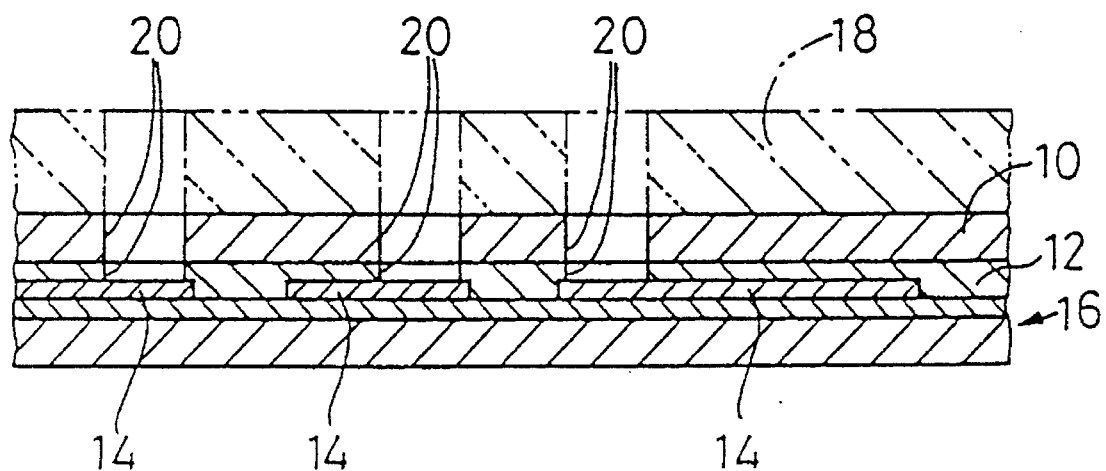
Fig. 1(c)

THERMOPLASTIC POLYIMIDE POLYMER; THERMOPLASTIC POLYIMIDE FILM; POLYIMIDE LAMINATE; AND METHOD OF MANUFACTURING THE LAMINATE

FIELD OF THE INVENTION

The present invention relates to thermoplastic polyimide polymer, thermoplastic polyimide film, polyimide laminate, and a method of manufacturing the polyimide laminate. More particularly, the invention relates to thermoplastic polyimide polymer featuring distinguished thermal resistant property, solid adhesion under low temperature, and low hygroscopic degree; thermoplastic polyimide film which is produced from this thermoplastic polyimide polymer and applicable to the formation of adhesive film and base film or cover-lay film for producing flexible printed circuit boards (FPC); polyimide laminate which consists of a laminate of layers of the above identified thermoplastic polyimide film and nonthermoplastic polyimide film and is usable for bilateral adhesive sheets, flexible copper coated laminated boards, or cover-lay film; and the invention also relates to the method of manufacturing the polyimide laminate.

BACKGROUND ART

Recently, as a result of rapidly promoted functional capacity and down-sizing of a variety of electronic apparatuses, there is a growing demand for further reduction of the size and weight of electronic parts built therein. In particular, there is a sharply growing demand for flexible printed circuit boards (hereinafter merely referred to as FPC) for mounting a variety of electronic parts against conventional rigid printed circuit boards.

Basically, any of conventional flexible printed circuit boards has such a structure in which "cover-lay film" is coated on the surface of circuit patterns formed on a soft and thin base film. At present, in order to satisfy essential characteristics such as mechanical characteristic, electrical characteristic, chemical resistant property, thermal resistant property, and resistance to environmental condition normally being required for the base film and the cover-lay film, polyimide film has been used most extensively.

Sequential processes for manufacturing such a conventional flexible printed circuit board comprise the following: Initially, a flexible copper-coated laminate (FCCL) is formed by laminating a base polyimide film and a copper foil. Next, a resist pattern is formed on the produced conductor via a screen printing process or a photo-resist process, and then a circuit pattern is formed by executing an etching process. Finally, a cover-lay film is laminated on the surface of circuits of the film having the circuit pattern formed therein. When executing the above sequential processes, either acrylic adhesive agent or epoxy adhesive agent is mainly used for laminating :the base film with copper foil or laminating the cover-lay film on the surface of the built-in circuits.

Nevertheless, any of these conventional adhesive agents proved to be poor in the thermal resistant property and yet contains high rate of hygroscopicity. In consequence, physical properties of the produced flexible printed circuit boards such as the thermal resistant property and dimensional stability are dependent on the physical properties of the used adhesive agent, thus preventing the polyimide film being used for the cover-lay film and the base film from fully exerting own distinct performance characteristic in many cases. In association with the promotion of multiplied layers of flexible printed circuit boards in recent years, there is a growing demand for bi-lateral adhesive sheets having both surfaces of the base film coated with adhesive agent. However, since either acrylic adhesive agent or epoxy adhesive agent is also used for producing such a bilateral adhesive sheet, like the above case, polyimide film cannot fully exert own distinct performance characteristic.

In order to laminate a cover-lay film on the surface of the built in circuits in the course of manufacturing a flexible printed circuit board, it is a conventional practice to execute those sequential processes including an initial step to adhere either of the above adhesive agents onto the surface of a polyimide film, a next step to process a cover-lay film having one-side surface adhered with the above adhesive agent into a predetermined shape, a next step to superpose the formed cover-lay film on the surface of circuits of the polyimide film having circuit patterns formed thereon, a next step to correctly position them, and a final step to thermally bond them via a pressing means. However, when applying either of the above-cited adhesive agents in the course of executing the above processes, since perforation cannot be executed after bonding the cover-lay film with the flexible printed circuit board, before bonding the polyimide film, the conventional art has been obliged to perforate the cover-lay film to provide through-holes or windows at terminals of circuits formed on the conductor or at junctions connected to component parts.

On the other hand, not only difficulty is involved in properly perforating an extremely thin cover-lay film, but working efficiency is also poor and it is costly because the work for positioning the perforated cover-lay film at a predetermined position of the flexible printed circuit board has conventionally and substantially been executed via manual means. Furthermore, if there were too thin thickness of layer of adhesive agent for bonding the cover-lay film, it may lead to the generation of void effect between the flexible printed circuit board and the cover-lay film. Conversely, if there were too thick layer of adhesive agent, it often causes the adhesive agent to ooze itself into perforated domains to result in the faulty conductive effect.

In order to fully solve the above problems, the invention has been achieved by way of providing improved thermoplastic polyimide polymer, improved thermoplastic polyimide film, improved polyimide laminate, and an improved method of manufacturing the polyimide laminate, which respectively feature distinct thermal resistant property and are suitably usable for the formation of cover-lay adhesive agent and layers of adhesive agent for bonding a cover-lay film or flexible copper-coated layers or bilateral adhesive sheets each featuring distinct workability and adhesive property.

DISCLOSURE OF THE INVENTION

Essentials of the inventive thermoplastic polyimide polymer for achieving the above object are exemplified in general formula (1) shown below; wherein $Ar_1$, $Ar_2$, $Ar_4$, and $Ar_6$ respectively represent divalent organic radicals; $Ar_3$ and $Ar_5$ respectively represent quadrivalent organic radicals. Symbolic characters l, m, and n respectively represent positive integer of 0 or 1 or more than 1, wherein the sum of l and m is 1 or more than 1, and wherein symbolic character to represents positive integer of 1 or more than 1.

General formula (1)

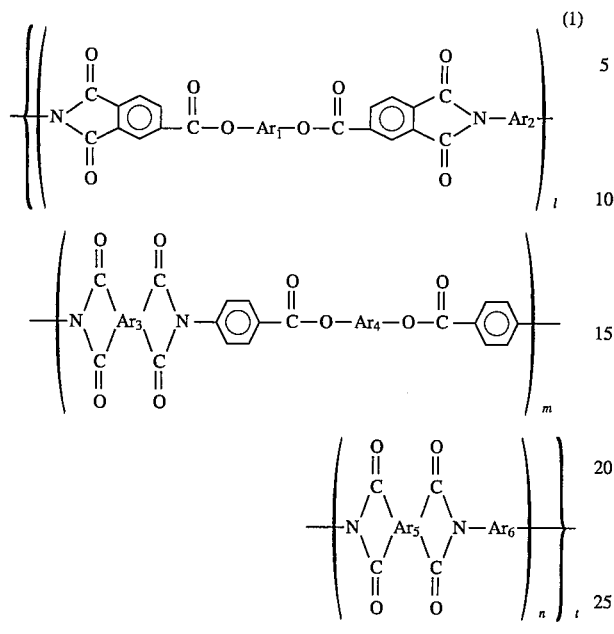

The inventive thermoplastic polyimide polymer characteristically contains $Ar_1$ in its own general formula (1), wherein the $Ar_1$ component is at least one kind selected from a group of divalent organic radicals shown in the following constitutional formula:

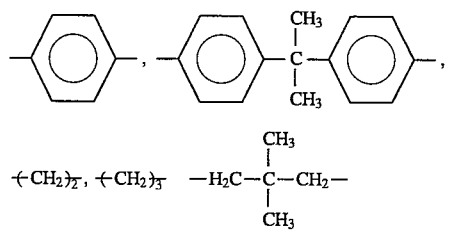

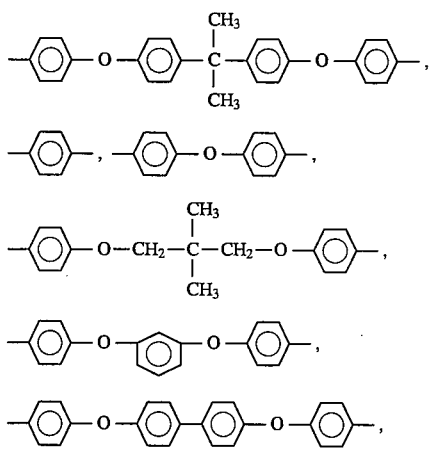

The inventive thermoplastic polyimide polymer characteristically contains $Ar_2$ in its own general formula (1), wherein the $Ar_2$ component is at least one kind selected from a group of divalent aromatic radicals shown in the following constitutional formulas:

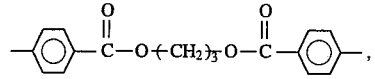

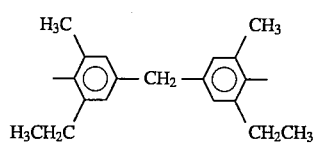

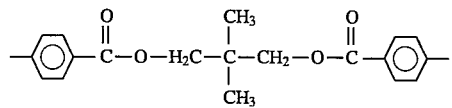

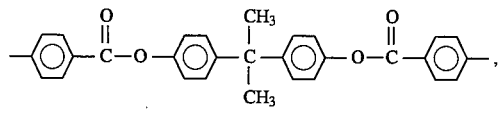

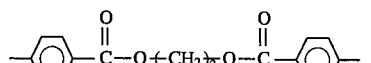

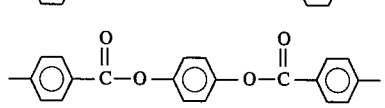

The inventive thermoplastic polyimide polymer characteristically contains $Ar_3$ in its own general formula (1), wherein the $Ar_3$ component is at least one kind selected from a group of quadrivalent aromatic radicals shown in the following constitutional formula:

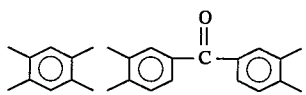

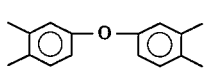

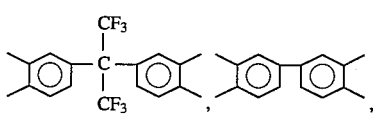

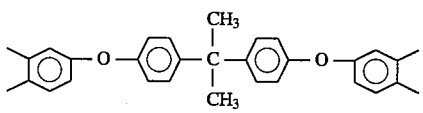

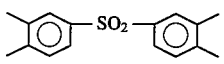

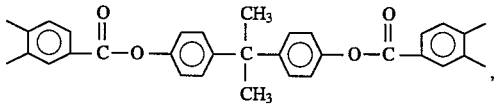

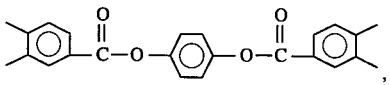

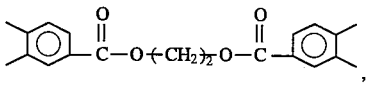

-continued

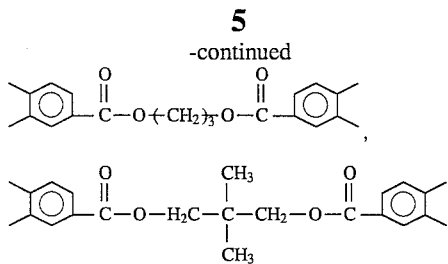

The inventive thermoplastic polyimide polymer characteristically contains $Ar_4$ in its own general formula (1), wherein the $Ar_4$ component is at least one kind selected from a group of divalent organic radicals shown in the following constitutional formula:

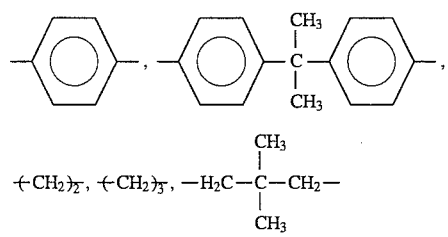

The inventive thermoplastic polyimide polymer characteristically contains $Ar_5$ in its own general formula (1), wherein the $Ar_5$ component is at least one kind selected from a group of quadrivalent aromatic radicals shown in the following constitutional formulas:

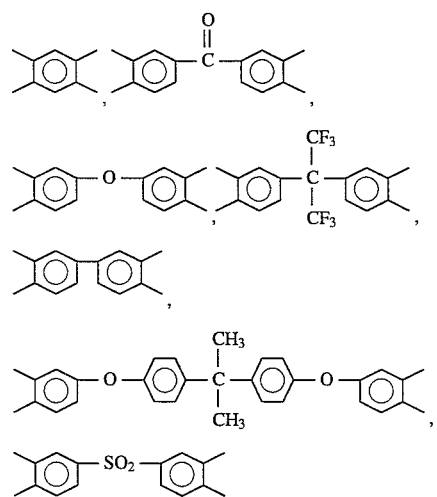

The inventive thermoplastic polyimide polymer characteristically contains $Ar_6$ in its own general formula (1), wherein the $Ar_6$ component is at least one kind selected from a group of divalent aromatic radicals shown in the following constitutional formulas:

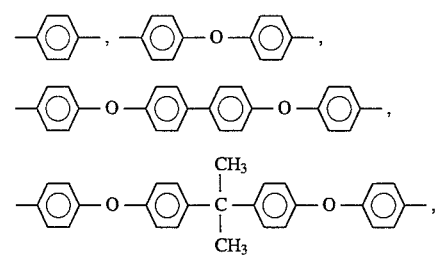

-continued

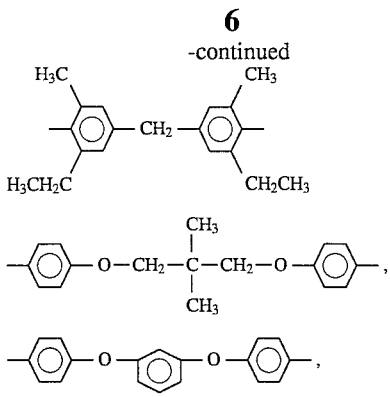

It is an essential of the inventive thermoplastic polyimide film that the inventive thermoplastic polyimide polymer specified in any of the above formulas is formed into film structure.

It is an essential of the inventive polyimide laminate that the inventive thermoplastic polyimide polymer specified in any of the above formulas is laminated as of the filmed form on another film which is subject to exfoliation.

It is another essential aspect of the inventive polyimide laminate that the inventive thermoplastic polyimide polymer specified in any of the above formulas is laminated as of the filmed form on both surfaces or a single surface of nonthermoplastic polyimide film.

It is another essential aspect of the inventive polyimide laminate that the laminate itself comprises a base film layer composed of nonthermoplastic polyimide polymer, an adhesive-agent layer composed of any of the above-specified inventive thermoplastic polyimide polymers, and a conductive layer composed of electrically conductive material.

It is an essential aspect of the inventive method of manufacturing the inventive polyimide laminate that a base film layer composed of nonthermoplastic polyimide polymer is initially coated with the solution of a precursor of any of the above specified thermoplastic polyimide polymers, and then, after executing a drying process and an imidizing process, the yielded thermoplastic polyimide layer is superposed with a conductive layer thereon, and finally, the superposed layers are thermally treated and pressurized to eventually yield the inventive polyimide laminate.

It is another essential aspect of the inventive method of manufacturing the inventive polyimide laminate that a base film composed of nonthermoplastic polyimide polymer is sequentially superposed with a film composed of any of the above-specified thermoplastic polyimide polymers and a conductive layer thereon, and then, the superposed layers are thermally treated and pressurized to eventually yield the inventive polyamide laminate.

BRIEF DESCRIPTION OF THE DRAWINGS

FIG. 1 is an explanation of the inventive method of bonding a cover-lay film adhered with the inventive cover-lay adhesive agent onto a flexible printed circuit board, wherein (a), (b), and (c) respectively exemplify sectional views of stepwise processes.

OPTIMAL FORM FOR EMBODYING THE INVENTION

Figure 2A:
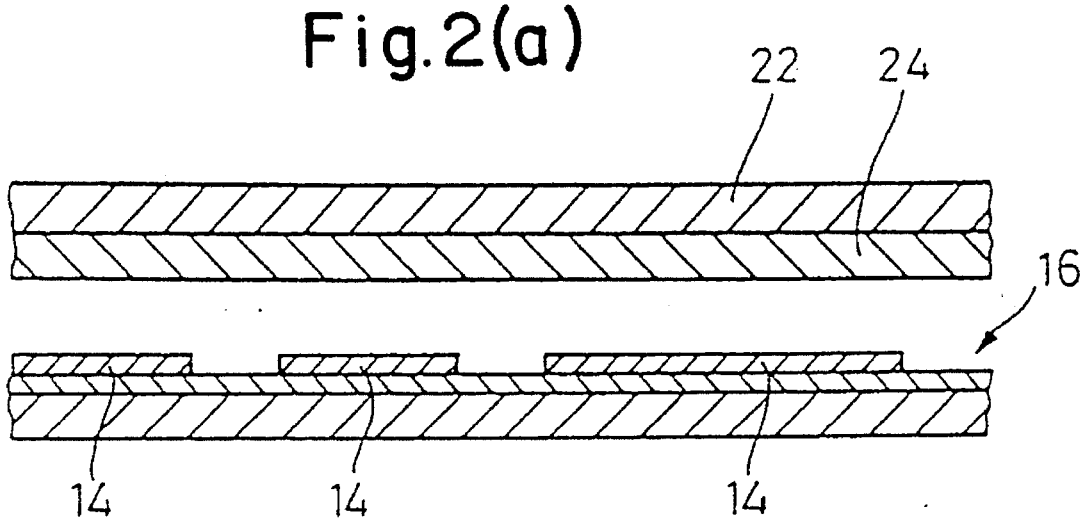
FIG. 2 is an explanation of the inventive method of bonding a cover-lay film composed of the inventive thermoplastic polyimide polymer onto a flexible printed circuit board, wherein (a), (b), and (c) respectively exemplify sectional views of stepwise processes.

Composition of the improved thermoplastic polyimide polymer, thermoplastic polyimide film, and polyimide laminate, and the method of manufacturing the polyimide laminate according to the invention are described below.

First, the method of formulating solution of polyamide-acid polymer as the inventive thermoplastic polyimide polymer is described below. Initially, diamine represented by general formula (2) shown below is dissolved or diffused in organic solvent in inert gas atmosphere such as argon or nitrogen, wherein $Ar_7$ shown in general formula (2) designates a divalent organic radical.

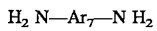
(2)

Next, only ester-acid dianhydride represented by general formula (3) shown below (in which $Ar_8$ designates a divalent organic radical) or a mixture of the ester-acid dianhydride and at least one kind of organic tetracarbonic acid dianhydride represented by general formula (4) shown below (in which $Ar_9$ designates a quadrivalent organic radical) is added to the above diamine solution in a state in which the above mixture remains solid or being dissolved in organic solvent, and finally, polyamide-acid polymer solution being a precursor of the inventive thermoplastic polyimide polymer is produced.

General formula (3)

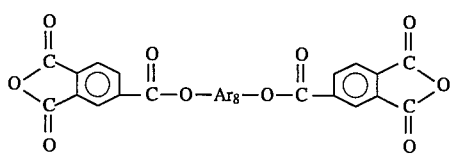
(3)

General formula (4)

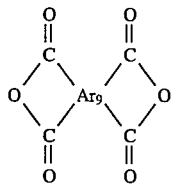
(4)

The inventive method of formulating polyamide-acid polymer solution being a precursor of the other inventive thermoplastic polyimide polymer is executed according to the sequential steps described below. Initially, only ester diamine represented by general formula (5) shown below or a mixture of this ester diamine and at least one kind of diamine represented by the above-identified general formula (2) is dissolved or diffused in organic solvent in inert gas atmosphere such as argon or nitrogen, wherein $Ar_{10}$ shown in general formula (5) designates a divalent organic radical.

General formula (5)

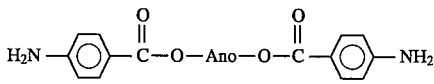
(5)

Next, only ester-acid dianhydride represented by the above identified general formula (3) or a mixture of this ester acid dianhydride and at least one kind of organic tetracarbonic acid dianhydride represented by the above-identified general formula (4) or a mixture of these ester acid dianhydrides and organic tetracarbonic acid dianhydride is added to the above diamine solution in a state in which said mixture remains solid or being dissolved in organic solvent, and finally, the novel polyamide-acid polymer solution being a precursor of the inventive thermoplastic polyimide polymer is produced.

While the above reaction is underway, it is also practicable for the inventive art to execute those sequential processes described below in such a way inverse from the above processes. Initially, fresh solution of ester-acid dianhydride represented by the above-identified general formula (3) or fresh solution of at least one kind of organic tetracarbonic acid dianhydride represented by the above-identified general formula (4) or fresh solution of a mixture of these ester-acid dianhydrides and organic tetracarbonic dianhydride is prepared. Next, only ester diamine represented by the above-identified general formula (5) or at least one kind of diamine represented by the above-identified general formula (2) or a mixture of this ester diamine and at least one kind of diamine represented by the above-identified general formula (2) is added to the above fresh solution in a state in which said mixture remains solid or being dissolved in organic solvent or in slurry condition.

It is essential that the above reaction be executed in a temperature ranging from –10° C. to a maximum of 50° C., preferably in a range from –5° C. to a maximum of 20° C. It is also essential that the above reaction be executed within a period ranging from a half hour to a maximum of 3 hours. As a result of the execution of the above reactions, the novel polyamide-acid polymer being a precursor of the inventive thermoplastic polyimide polymer represented by general formula (1) shown below can properly be yielded.

General formula (1)

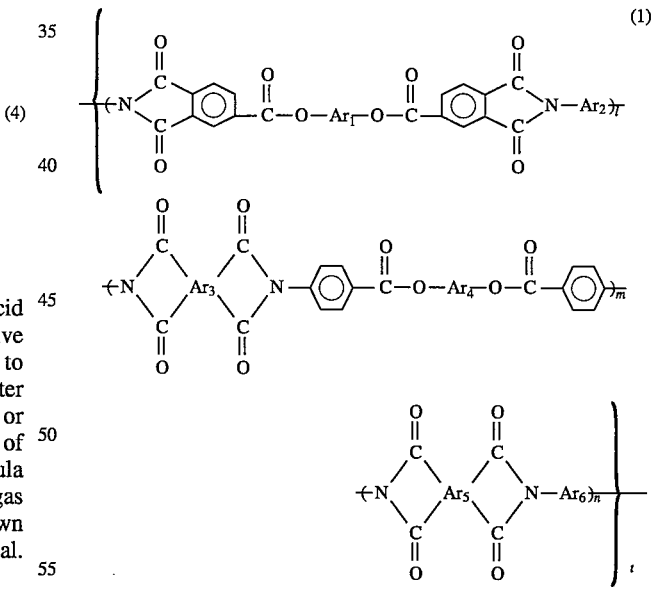
(1)

In order to properly yield the inventive thermoplastic polyimide polymer from the above-exemplified polyamide-acid polymer solution being a precursor thereof, it is suggested that a method to thermally and/or chemically dehydrate and cyclize.

Next, a typical method of producing thermoplastic polyimide film composed of thermoplastic polyimide polymer is exemplified below. When executing a method to thermally imidize the thermoplastic polyimide polymer, initially, the solution of the above-identified polyamide-acid polymer is formed into film on a supporting body such as a supporting plate, an organic film including PET, a drum or an endless belt by way of flow or coating with the solution. After a drying process, a self-supporting film is generated. It is desired that the drying process be executed at a temperature below 150° C. for about 5 through 90 minutes. Next, the film is further heated and dried until fully being imidized before eventually producing a novel thermoplastic polyimide film consisting of thermoplastic polyimide polymer. Optimum heating temperature ranges from 150° C. to a maximum of 350° C. In particular, it is desired that the heating process be executed at a temperature ranging from 250° C. to 300° C. Although there is no restriction on the speed of raising temperature during the drying process, it is desired that the temperature be gradually raised until reaching the above suggested range. Duration of the heating process depends on the film thickness and the maximum temperature available. However, it is generally desired that the heating be effected for a period of 10 seconds up to 10 minutes after reaching the maximum temperature. When heating a self-supporting film, it is suggested that the film be stripped off from the supporting base and then heat the stripped film by securing edges. This leads to the generation of satisfactory polymer containing negligible linear expansion coefficient, and thus this method is practically preferred.

The method to chemically imidize polyamide-acid polymer solution is executed by initially adding more than stoichiometric amount of dehydrating agent and tertiary amine corresponding to catalytic amount to the polyamide-acid polymer followed by a treatment in the same way as is done for thermal dehydration before eventually forming desired thermoplastic polyimide film.

The chemically imidizing process provides greater mechanical strength and less linear expansion coefficient for polyimide than the thermally imidizing process. In many cases, the chemically imidizing process and the thermally imidizing process are conjunctionally used.

As a result of imidizing the above polyamide-acid polymer by applying the thermally imidizing and/or the chemically imidizing processes, the inventive thermoplastic polyimide polymer represented by the above-identified general formula (1) is yielded, and yet, the inventive thermoplastic polyimide film composed of the thermoplastic polyimide polymer is produced by executing the above described chemical and/or thermal imidizing method.

Ester-acid dianhydrides irrespective of structure may be used for sufficing the ester-acid dianhydride represented by the above identified general formula (3) available for the invention. It is desired that the $Ar_8$ radical shown in the above general formula (3) be of divalent organic radical. Constitutional formulas of the $Ar_8$ radical are exemplified below.

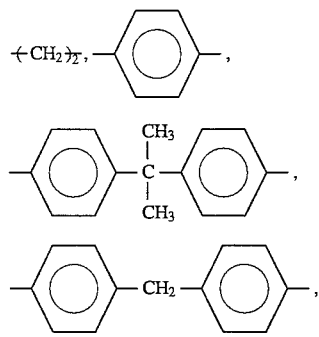

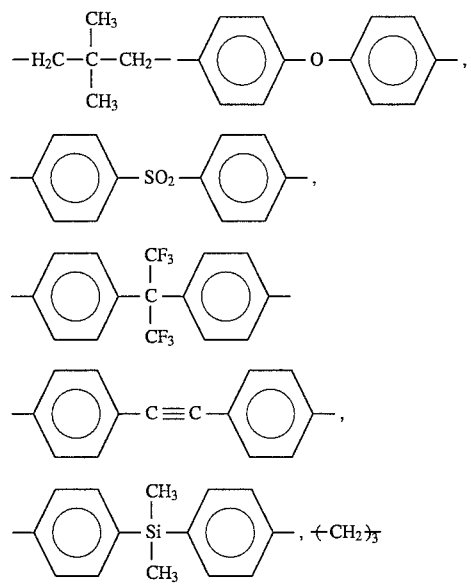

More particularly, in order to proportionate a variety of characteristics, it is preferred that the main constituents of the $Ar_8$ radical be of the following:

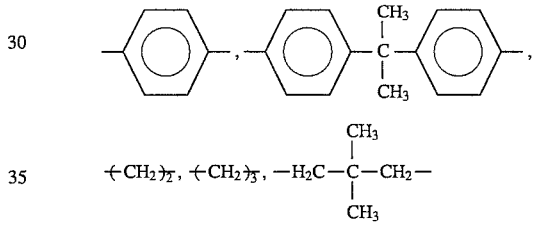

Ester diamines irrespective of the structure may be used for sufficing the ester diamine represented by the above-identified general formula (5). However, it is desired that the $Ar_{10}$ radical shown in the above general formula (5) be of divalent organic radical. Constitutional formulas of the $Ar_{10}$ radical are exemplified below.

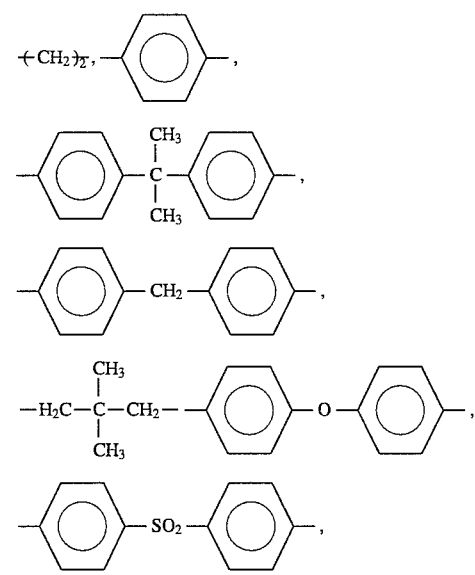

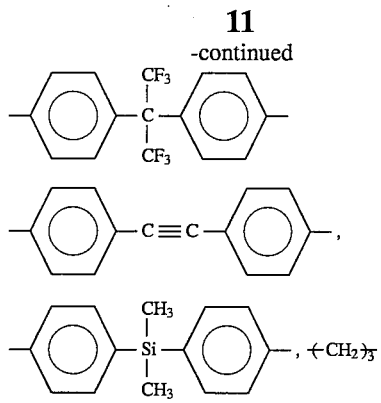

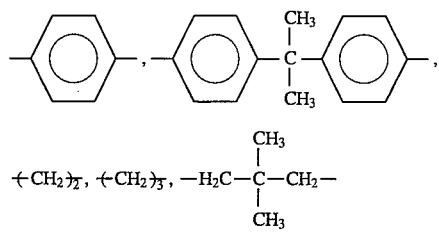

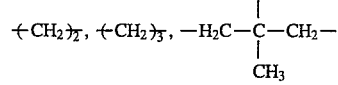

More particularly, in order to proportionate a variety of characteristics, it is preferred that the main constituents be of the following:

Organic tetracarbonic-acid dianhydrides irrespective of the structure may be used for sufficing the organic tetracarbonic-acid dianhydride available for the invention. However, the $Ar_9$ radical shown in the above-identified general formula (4) is of quadrivalent organic radical, and yet, it is preferred that the $Ar_9$ radical be of aromatic radical in particular. Constitutional formulas of the $Ar_9$ radical are exemplified below.

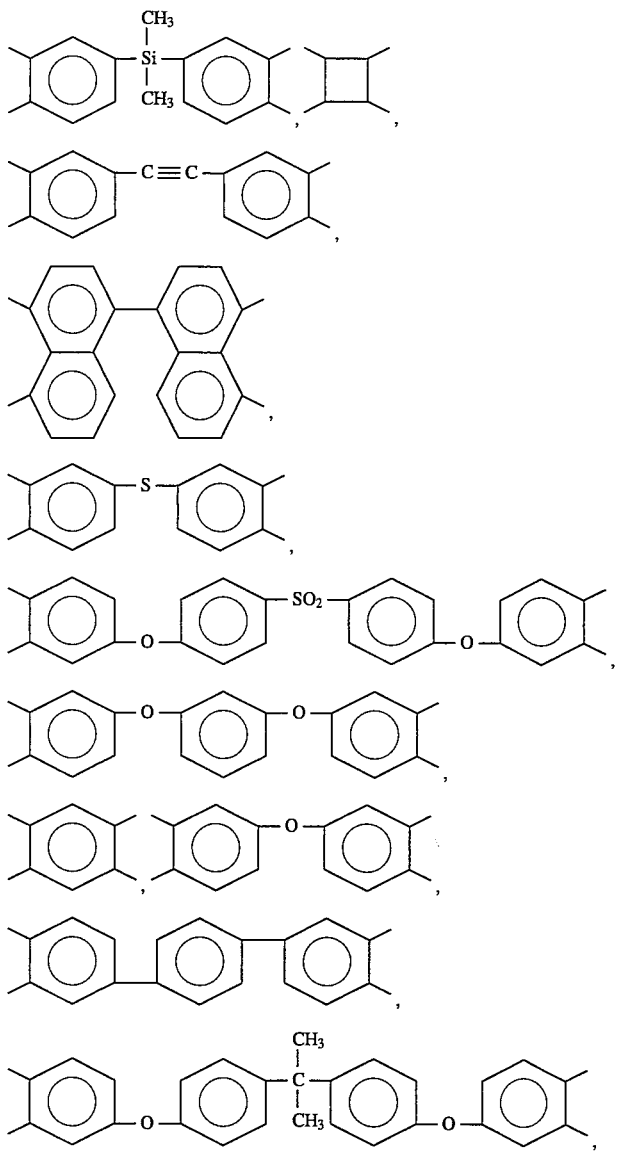

-continued
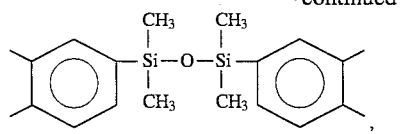
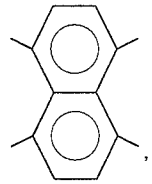
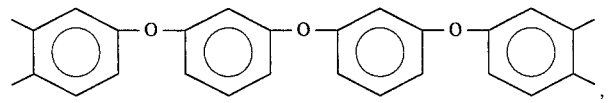
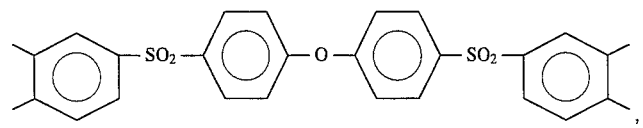
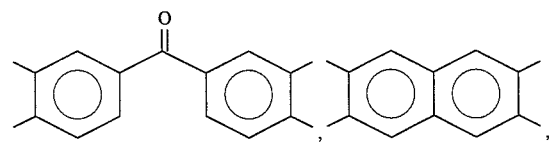
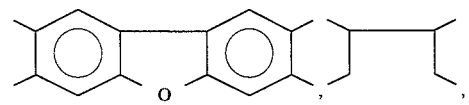
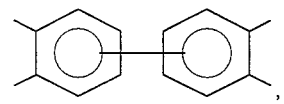
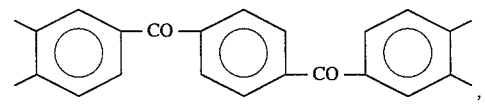
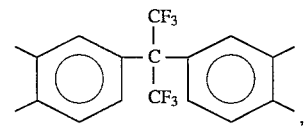
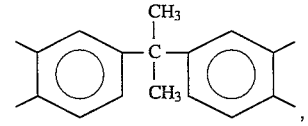
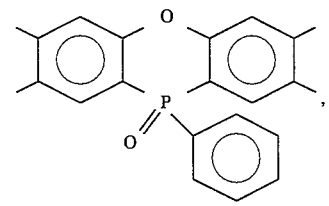
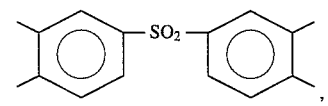

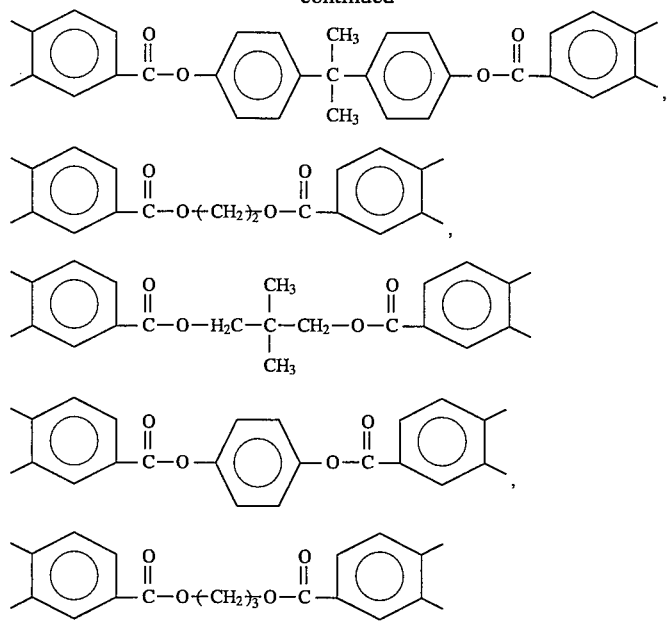

These organic tetracarbonic-acid dianhydrides may be used on a single base or by way of combining two or more than two of them with each other. More particularly, in order to proportionate a variety of characteristics, it is preferred that at least more than one kind of the above-exemplified constitutional formulas be of main constituent.

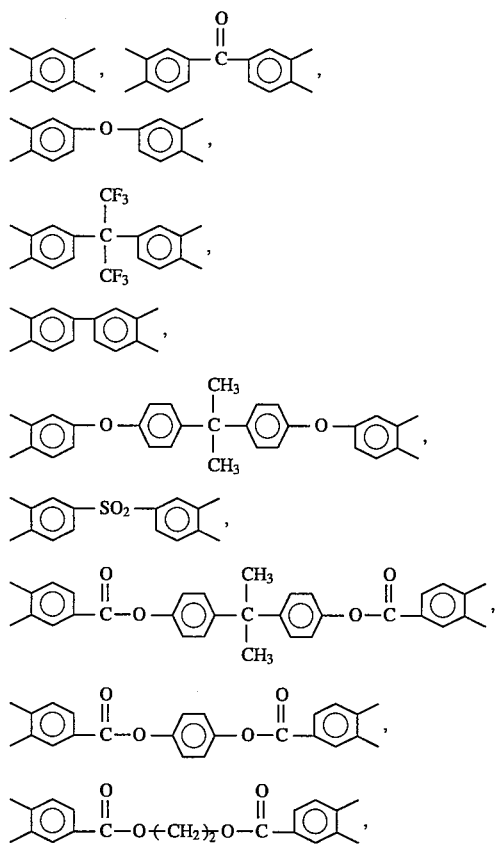

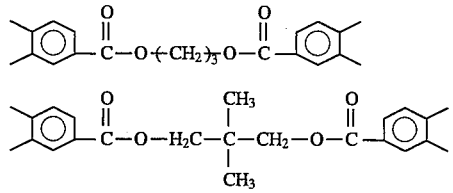

Substantially, insofar as being a divalent organic radical, any kind of divalent organic radical may be used for sufficing the $Ar_7$ component contained in diamine compound represented by the above-identified general formula (2). However, those aromatic radicals exemplified below are particularly suited for use.

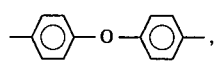

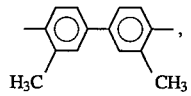

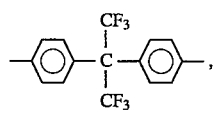

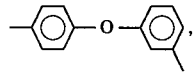

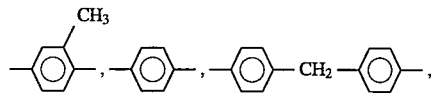

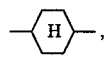

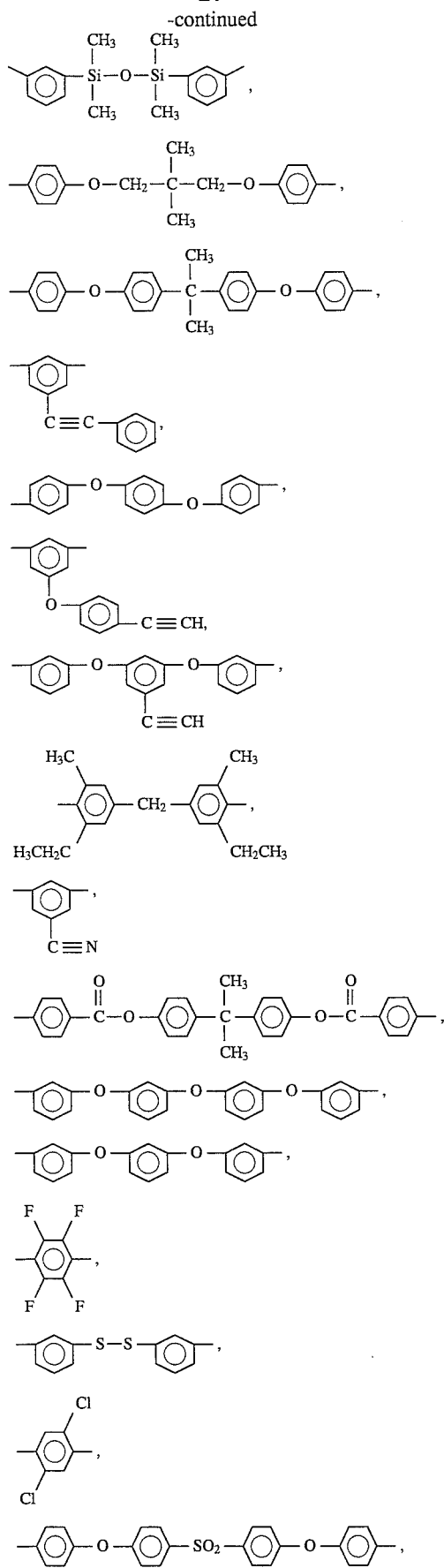
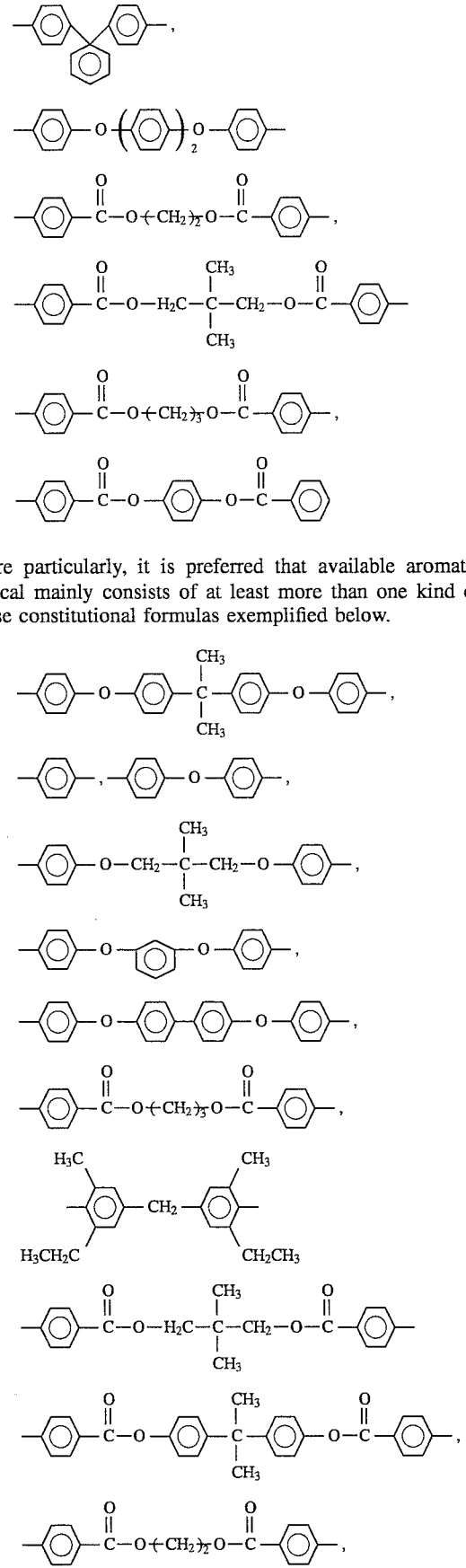
More particularly, it is preferred that available aromatic radical mainly consists of at least more than one kind of those constitutional formulas exemplified below.

-continued

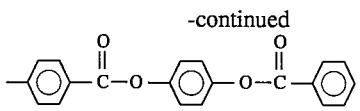

Those repeating numbers l, m, and n, per block unit present in the thermoplastic polyimide polymer represented in the above identified general formula (1) are respectively positive integers of or 1 or more than 1. The sum of the repeating numbers l and m should be one or more than one. In particular, any of these repeating numbers l, m, and n, should preferably be 15 or less than 15. This is because, if the repeating number n ever exceeds 15 times the sum of the repeating numbers l and m, it will cause the ratio of copolymerization to become defective to result in the minimized effect of polymerization. More particularly, this is because actual adhesive property under low temperature cannot properly be identified. It is admissible that those units each containing different values of the repeating numbers l, m, and n, may be present in each molecule Of polymers. In particular, it is desired that the values of these repeating numbers l, m, and n, be constant.

It is also admissible that repeating number t in a block shown in the above general formula (1) be of positive integer of one or more than one. Although there is no restriction on the molecular weight of the inventive polyimide polymer in particular, in order to securely maintain the strength of the yielded polyimide polymer, it is desired that the polyimide polymer be provided with more than 10000 of mean molecular weight numerically.

In many cases, difficulty is involved in the direct measurement of molecular weight of polyimide polymer. In place of the direct measurement, the molecular weight of polyimide polymer is inferentially measured via an indirect measuring method. For instance, when polyimide polymer is synthesized from polyamide acid, a specific value corresponding to the molecular weight of polyamide acid polymer is determined to be the molecular weight of polyimide polymer.

Those organic solvents exemplified below are usable for generating the productive reaction of polyimide-acid polymer solution, for example, including the following; sulfoxide solvent such as dimethyl sulfoxide or diethyl sulfoxide, formamide solvent such as N, N-dimethyl formamide or N, N-diethyl formamide, or acetoamide solvent such as N, N-dimethyl acetoamide or N,N-diethyl acetoamide, or the like. These organic solvents may be used on an individual base or by way of mixing plural kinds with each other. The above-cited polar solvents may also be mixed with any of those non-solvents of polyamid-acid polymer such as acetone, methanol, ethanol, isopropanol, or benzene methylcellosolve, for example.

By virtue of novel constitutional features described above, the inventive thermoplastic polyimide polymer has evident glass transition point between 100° C. and 250° C. Accordingly, polyimide film and copper foil or polyimide films can easily be bonded with each other merely by laminating them at a temperature close to the glass transition point, and yet, the inventive thermoplastic polyimide film yields satisfactory adhesive property under low temperature. It was also proven that the inventive thermoplastic polyimide film merely exhibited about 1% of hygroscopic degree after being immersed in pure water at 20° C. for 24 consecutive hours. Furthermore, it was also confirmed that the inventive thermoplastic polyimide film exhibited satisfactory resistivity against radioactive rays.

Accordingly, in place of conventional acrylic or epoxy adhesive agent, the inventive thermoplastic polyimide film is ideally usable for composing flexible copper-coated laminates and bilateral adhesive sheets or adhesive-agent layers for cover-lay films. Next, fields of application of the inventive thermoplastic polyimide polymer are described below.

The inventive thermoplastic polyimide polymer is practically usable by thermally melting it or by way of imidizing it after being coated on a bonding object as of the state of polyamide-acid polymer solution being a precursor of the above polyimide polymer. Furthermore, after being formed into thermoplastic polyimide film, the inventive thermoplastic polyimide film can serve as adhesive film. To suffice those uses cited above, supply can be effected as of polyimide film, thus providing handling convenience.

Characteristically, since the inventive thermoplastic polyimide film conceptually comprises films and sheet forms, and yet, since the inventive polyimide film exhibits distinctly low hygroscopic property, not only for an adhesive-agent film, but it also ideally serves as a base film and a cover-lay film of flexible copper-coated laminates. Furthermore, since the inventive thermoplastic polyimide film is highly resistant to radioactive rays, it is also effectively applicable to a variety of apparatuses potentially being affected by radioactive rays.

Furthermore, the inventive thermoplastic polyimide laminate comprising the inventive thermoplastic polyimide polymer layers being laminated on both surfaces or a single surface of nonthermoplastic polyimide film serving as a base film is effectively applicable to a bilateral or single-surface polyimide adhesive sheet containing adhesive-agent layer consisting of the inventive thermoplastic polyimide polymer layers. Furthermore, the inventive polyimide laminate is also usable for composing a flexible copper-coated laminate by way of bonding it with copper foil. Incidentally, bilateral adhesive sheets containing adhesive-agent layers on both surfaces of base film are suitably used for the base material for composing flexible printed circuit boards which have been multi-layered in recent years. In addition, bilateral adhesive sheets are also usable for the cover, lay film adhered with adhesive agent.

The inventive polyimide laminate can easily be manufactured by initially superposing the inventive thermoplastic polyimide polymer film on both surfaces or on a single surface of a basic polyimide film such as "APICAL" (a product and a registered trade name of Kanegafuchi Chemical Industrial Co., Ltd. ) followed by the execution of a thermal bonding process.

As another method of manufacturing the inventive polyimide laminate, it is also practicable to initially dissolve the inventive thermoplastic polyimide polymer via a heating process and then directly coat the melted polyimide polymer on both surfaces or on a single surface of the basic polyimide film.

It is also practicable for the production of the inventive polyimide laminate to initially spread polyamide-acid polymer solution being a precursor of the inventive thermoplastic polyimide polymer on a basic polyimide film, and then dry the spread solution before eventually imidizing the dried polymer content.

When providing the inventive thermoplastic polyimide polymer layers on both surfaces of a base film, after completing the above processes, polyamide-acid polymer solution is spread over on the other surface of the base film, and then, after completing a drying process, the dried polymer content is imidized. It is also practicable to simultaneously spread polyamide-acid polymer solution over both surfaces of the basic polyimide film before imidizing the spread solution. In addition, it is also practicable to initially spread polyamide-acid polymer solution over the basic polyimide film, and then, after completing a drying process, polyimide-acid polymer solution is spread over the other surface of the base film, and then, after completing a drying process, polyamide-acid polymer films on both surfaces of the base film is eventually imidized.

The inventive polyimide laminate completed from the above sequential processes characteristically contains outstanding thermal resistant property, adhesive property under low temperature, workability, and low hygroscopic property. Copper foil can securely be bonded to the inventive :polyimide laminate by laminating superposed copper foils at a temperature close to the glass transition point (from 100° C. to 250° C.) of thermoplastic polyimide polymer layers which make up adhesive-agent layers, thus making it possible to easily produce flexible copper-coated laminates. In particular, bilateral adhesive polyimide sheets are ideally suited for the production of the flexible copper-coated laminates capable of satisfying industrial demand for achieving the multi-layering of flexible printed circuit boards.

Not only using the novel polyimide laminates described above, but the flexible copper-coated laminates can also be manufactured by sequentially executing those processes including the superposition of a basic nonthermoplastic polyimide film, the inventive thermoplastic polyimide film serving as the adhesive-agent film, and conductive layers such as copper foils followed by the execution of a thermal bonding process. Characteristically, not only serving as adhesive-agent film, but the inventive thermoplastic polyimide film itself can also serve as the base film to be laminated with the inventive thermoplastic polyimide film and copper foils for adhesion with each other before eventually producing a double-layer flexible copper-coated laminate devoid of adhesive-agent layers.

Although aluminium, iron, nickel, and other conductive materials may be used for composing conductive layers, copper foil is particularly suited for use.

The inventive thermoplastic polyimide film and the polyimide laminate are ideally suited for composing adhesive-agent layers and the base film of a flexible copper-coated laminate. The flexible copper-coated laminate and the bilateral adhesive polyimide sheet produced by the execution of the above-exemplified inventive art conjunctionally contain distinctive thermal resistant property, adhesive property under low temperature, workability, low hygroscopic property. In particular, the inventive bilateral adhesive polyimide sheet is effective for producing bilateral flexible printed circuit boards and multiple-layer printed circuit boards.

Characteristically, since the inventive polyimide laminate totally being composed of polyimide is compatible with alkaline etching process, perforation can easily be achieved. Accordingly, in the course of manufacturing flexible printed circuit boards, after completing an etching process against copper foil of flexible copper-coated laminates, polyimide can be perforated via an alkaline etching process to facilitate the production of flexible printed circuit boards. Furthermore, since the inventive polyimide laminate merely exhibits about 1% of low hygroscopic degree after being immersed in pure water at 20° C. for 24 consecutive hours, the inventive polyimide laminate is optimal for the base film of flexible printed circuit boards. In addition, the inventive polyimide laminate is evidentially resistant against radioactive rays without incurring transmutation nor discoloration from irradiation of radioactive rays. Because of this distinctive resistivity, the inventive polyimide laminate can usefully be utilized for such apparatuses potentially being affected by radioactive rays. There is no limit on other uses.

Furthermore, the inventive thermoplastic polyimide film and the inventive polyimide laminate can effectively be used for composing cover-lay adhesive agent and cover-lay films. The inventive thermoplastic polyimide film can practically be utilized for the cover-lay adhesive agent based on those sequential steps described below.

As is exemplified in FIG. 1(a), initially, a polyimide film composed of nonthermoplastic polyimide polymer such as "APICAL" (a product and a registered trade name of Kanegafuchi Chemical Industrial Co., Ltd.), another film 12 composed of the inventive thermoplastic polyimide polymer, are superposed on the conductive surface of a flexible printed circuit board 16 accommodating a circuit 14 thereon. Next, as is exemplified in FIG. 1(b), the above superposed components are thermally bonded together to easily achieve adhesion. Next, as is exemplified in FIG. 1(c), initially, a resist film 18 is formed on a predetermined position of the polyimide film 10 by applying a photolithographic process or a screen printing process. Next, a plurality of through-holes 20 are formed through the polyimide film 10 and the other film 12 via an alkaline etching process. As is exemplified above, by executing a perforation process after adhering the polyimide film 10 serving as a cover-lay film onto the flexible printed circuit board 16 with the other film 12 functioning as cover-lay adhesive agent, a flexible printed circuit board easily adhered with a cover-lay film can be manufactured.

The inventive polyimide laminate manufactured via the above exemplified method can be used as a cover-lay film adhered with cover-lay adhesive agent. Accordingly, the cover-lay film can properly be adhered with a perforated cover film via an alkaline etching process after thermally bonding the adhesive surface and the conductive surface of the flexible printed circuit board previously being laminated with each other, thus easily manufacturing such a flexible printed circuit board properly being adhered with a cover-lay film.

As was described above, although it is practicable to adhere a cover-lay film composed of nonthermoplastic polyimide polymer onto a flexible printed circuit board with cover, lay adhesive agent, since the inventive thermoplastic polyimide polymer merely exhibits about 1% of low hygroscopic degree after being immersed in pure water at 20° C. for 24 hours, when implementing the invention, the film composed of the inventive thermoplastic polyimide polymer functioning as cover-lay adhesive agent may be available for the cover-lay film.

Figure 2B:
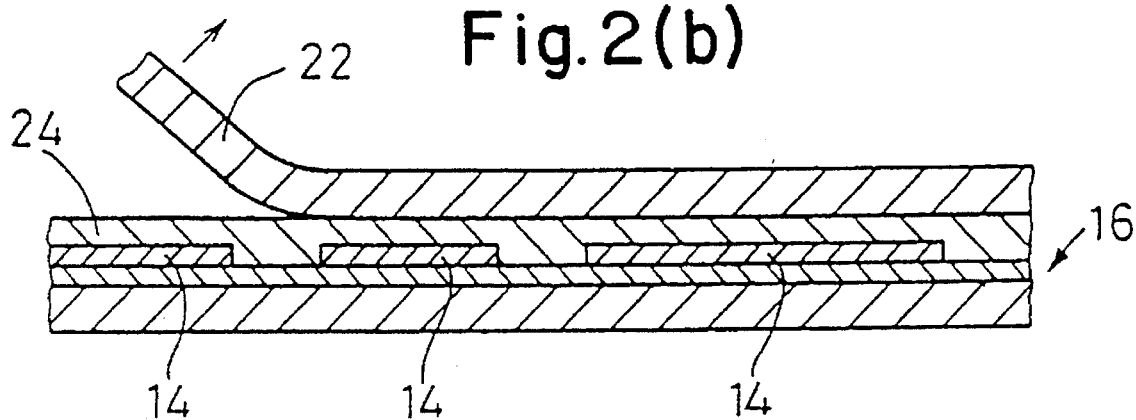
Figure 2C:
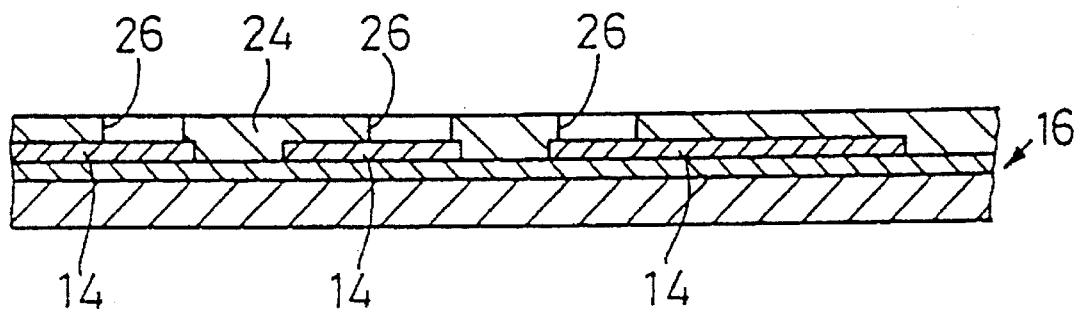

For instance, as is exemplified in FIG. 2, initially, polyamide acid being a precursor of the thermoplastic polyimide polymer functioning as cover-lay adhesive agent is fluidly spread over an exfoliatable paper or an exfoliatable film 22 such as a PET film for coating it, and then, the coated polyimide acid is imidized before eventually laminating a cover-lay film 24 composed of the inventive thermoplastic polyimide polymer on the exfoliatable film 22. Furthermore, as is exemplified in FIG. 2(a) and (b), the cover-lay film 24 is then thermally bonded with the conductive surface of a flexible printed circuit board 16 accommodating a circuit 14 formed thereon, and then, the exfoliatable film 22 is stripped off. Next, as is exemplified in FIG. 2(c), a plurality of through-holes 26 are formed in the cover-lay film 24 via an alkaline etching process before easily forming up the flexible printed circuit board 16 adhered with the cover-lay film 24.

It is also practicable to initially form a cover-lay film from the inventive thermoplastic polyimide polymer substantially being cover-lay adhesive agent, and then, the cover-lay film is thermally adhered to the flexible printed circuit board 16 via an exfoliatable film before eventually removing the exfoliatable film.

The cover-lay adhesive agent or film produced from the above methods is totally composed of polyimide. Since an alkaline etching process can be effected against polyimide, perforation can easily be executed after the adhesion of polyimide cover-lay film to the flexible printed circuit board. Accordingly, the inventive method not only dispenses with a preliminary positioning work otherwise needed for any conventional method, but the inventive method can also simplify the manufacturing processes by way of executing the positioning work simultaneous with the execution of an alkaline etching of the base film of the flexible printed circuit board.

As is evident from the above description, the inventive thermoplastic polyimide film is optimally usable for the cover-lay adhesive agent which is inserted between a cover-lay film composed of non-thermoplastic polyimide film and a flexible printed circuit board. In addition, the inventive polyimide laminate comprising the previously formed laminate of nonthermoplastic polyimide film and the inventive thermoplastic polyimide film can be used to serve as a cover-lay film adhered with cover-lay adhesive agent. Furthermore, the inventive thermoplastic polyimide film itself may serve as a cover-lay film. There is no limit on other uses of the inventive thermoplastic polyimide film.

The above description has solely referred to the inventive thermoplastic polyimide polymer, the inventive thermoplastic polyimide film, the inventive polyimide laminate, and exemplified method of manufacturing the inventive polyimide laminate. It should be understood however that the scope of the invention is not solely limited to the above examples, but the invention can also be implemented by way of adding a variety of improvements, alterations, and modifications based on the knowledges of those skilled in the art without departing from the fundamental scope thereof.

The invention is further described by way of examples. It should be understood however that the scope of the invention is by no means limited to the following examples.

EXAMPLE 1

Initially, 16.9 grams of 2,2-bis[4-(4-aminophenoxy)phenyl]propane (hereinafter merely referred to as BAPP) and 25.4 grams of dimethyl formamide (hereinafter merely referred to as DMF) were respectively sampled in a female flask (1) having 50 ml of capacity. Next, using a stirrer, the sampled BAPP and DMF were stirred until fully being dissolved. Separately, 1.0 gram of BAPP and 10.0 grams of DMF were respectively put in another female flask (2) having 50 ml of capacity, and then, both samples were also stirred until fully being dissolved therein. Separately, 11.9 grams of 2,2-bis (4-hydroxyphenyl) propane dibenzoate-3,3'4,4'-tetracarboxylic acid dianhydride (hereinafter merely referred to as ESDA), 4.5 grams of pyromellit acid dianhydride (hereinafter merely referred to as PMDA), and 25.0 grams of DMF, were respectively put in a 500 ml-capacity three-necked flask equipped with a stirrer. While being cooled off in ice water and replacing atmosphere in the flask with nitrogen, sampled chemical constituents were stirred until fully being dissolved therein.

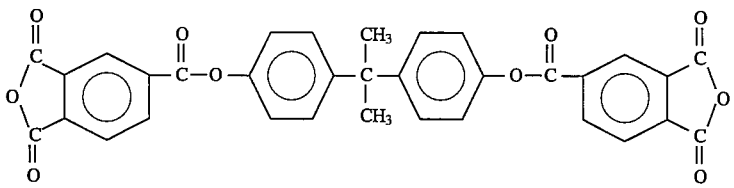

Next, while stirring the previously prepared BAPP solution in the 50 ml-capacity female flask (1), the stirred BAPP solution was quickly poured into the 500 ml-capacity three-necked flask, and then the mixed solution was aged for a half hour while continuously stirring it. Next, while watching the viscosity of the mixed solution in the 500 ml-capacity three-necked flask, the previously prepared BAPP solution in the 50 ml-capacity female flask (2) was gradually put in the three-necked flask. After reaching the maximum viscosity, the transfer of the BAPP solution from the 50 ml-capacity female flask (2) to the 500 ml-capacity three-necked flask was terminated, and then, the mixed solution was aged for an hour while continuously being stirred in the three-necked flask. Next, 78.2 grams of DMF was added to the mixed solution, and then, after fully stirring the mixed solution, polyamide acid polymer solution was eventually yielded.

Next, polyimide film (a product of Kanegafuchi Chemical Industrial Co., Ltd. ) was superficially coated with the yielded polyamide polymer solution. After being heated at 80° C. for 25 minutes, the polyamide polymer solution-coated film was further heated at 150° C., 200° C., 250° C. and 300° C. for 5 minutes each to effectuate imidation before eventually yielding novel polyimide laminate comprising the inventive thermoplastic polyimide polymer layers.

Next, based on the TMA and the ASTM D-570, inventors checked the glass transition point (°C.) and the hygroscopic degree (%) of the inventive thermoplastic polyimide polymer from the yielded polyimide laminate. In addition, in order to check adhesive property of the inventive polyimide laminate, based on JIS K6481, inventors checked the peeling strength (kg/cm) of a flexible copper-coated laminate manufactured from the lamination of thermoplastic polimide polymer layer surface of the yielded polyimide laminate and a copper foil having 35 μm of thickness by laminating them at 300° C. and 2.2 cm/min. of speed. The test results are presented in Table 1 shown below.

TABLE 1

|  | Glass transition point (°C.) | Peeling strength (kg/cm) | Hygroscopic degree (%) |
|---|---|---|---|
| Example 1 | 222 | 2.0 | 1.13 |
| Example 2 | 205 | 1.0 | 0.90 |
| Example 3 | 122 | 1.4 | 0.95 |
| Example 4 | 130 | 2.0 | 1.13 |
| Example 5 | 185 | 1.6 | 1.45 |
| Example 6 | 229 | 1.1 | 1.12 |
| Comparative | 238 | No adhesion | 1.98 |

TABLE 1-continued

| | Glass transition point (°C.) | Peeling strength (kg/cm) | Hygroscopic degree (%) |
|---|---|---|---|
| example 1 | | | |
| Comparative example 2 | 238 | 0.3 | 1.98 |
| Comparative example 3 | 178 | No adhesion | 1.98 |

EXAMPLE 2

Initially, 1.0 gram of ESDA and 10.0 grams of DMF were respectively sampled in a 50 ml-capacity female flask, which were then sufficiently stirred with a stirrer until fully being dissolved.

Independently, 12.9 grams of 2,2-bis(4-aminobenzyloxyphenyl) propane (hereinafter merely referred to as BABPP) and 38.7 grams of DMF were respectively sampled in a 500 ml-capacity three-necked flask equipped with a stirrer. Both samples were then sufficiently stirred until fully being dissolved while replacing atmosphere in the flask with nitrogen.

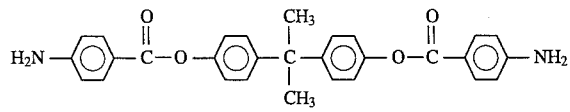

Next, 14.9 grams of ESDA was sampled in a 100 ml-capacity eggplant flask and then added to the dissolved BABPP solution as of solid form. Next, availing of 37.7 grams of DMF, residual ESDA adhered to the wall surface of the 100 ml-capacity eggplant flask was transferred to the 500 ml-capacity three-necked flask. After aging the mixed solution for about an hour while continuously stirring it, the ESDA solution in the 50 ml-capacity female flask was gradually put in the 500 ml-capacity three-necked flask while watching the viscosity of the solution in the three-necked flask. After reaching the maximum viscosity, the supply of the ESDA solution was terminated. After aging the mixed solution for an hour while continuously stirring it, polyamide acid polymer solution was eventually yielded.

Next, a PET film was superficially coated with the yielded polyamide-acid polymer solution, and then the coated film was thermally treated at 80° C. for 25 minutes before fully being dried to such an extent capable of retaining self-supporting solidness. Next, polyamide-acid polymer film was stripped off from the PET film and then secured to a metallic supporter. The secured polyamide acid polymer film was then sequentially heated at 150° C., 200° C., 250° C., and 300° C., for 5 minutes each until fully being imidized, and then, thermoplastic polyimide polymer film was eventually yielded.

Then, the yielded thermoplastic polyimide polymer film was superposed on a polyimide film "APICAL" (a product and a registered trade name of Kanegafuchi Chemical Industrial Co., Ltd.) and a copper foil having 35 μm of thickness, which were then laminated altogether at 300° C. and 2.2 cm/min. of speed. Finally, a flexible copper-coated laminate was yielded.

In order to check physical properties of the yielded flexible copper-coated laminate, as was done for the Example 1, inventors checked the glass transition point (°C.) and the hygroscopic degree (%) of the thermoplastic polyimide polymer and the peeling strength (kg/cm) of the flexible copper-coated laminate. The test results are also shown in Table 1.

EXAMPLE 3

Initially, 1.0 gram of ethylene glycol bis-trimellitic acid dianhydride (hereinafter merely referred to as TMEG) and 10.0 grams of dimethyl formamide (hereinafter merely referred to as DMF) were respectively sampled in a 50 ml-capacity female flask, which were then stirred therein with a stirrer before fully being dissolved. Independently, 22.7 grams of 2,2-bis (4-aminobenzyloxyphenyl) propane (hereinafter merely referred to as BABPP) and 68.1 grams of DMF were respectively sampled in a 500 ml-capacity three-necked flask, which were then stirred while replacing atmosphere in the flask with nitrogen until fully being dissolved therein. Next, 19.0 grams of TMEG was sampled in a 100 ml-capacity eggplant flask and then added to the BABPP solution as of solid form. Next, residual TMEG adhered to the wall surface of the 100 ml-capacity eggplant flask was put in the 500 ml-capacity three-necked flask via the aid of 21.5 grams of DMF. After aging the mixed solution for about an hour while continuously stirring it, the TMEG solution stored in the 50 ml-capacity female flask was gradually put in the 500 ml-capacity three-necked flask while watching the viscosity in the three-necked flask. After reaching the maximum viscosity, the supply of TMEG solution was terminated. Next, the mixed solution was aged for an hour while continuously being stirred in the three-necked flask, and finally, polyamide-acid polymer solution was yielded.

Before imidizing the yielded polyamide-acid polymer solution, the polyamide-acid polymer solution was formed into film by executing those sequential processes described below. After completing a laminated film, inventors checked physical properties. Initially, 2.0 grams of isoquinoline and 20.0 grams of acetic acid anhydride were respectively sampled in a 100 ml-capacity female flask, which were then sufficiently stirred. Next, the prepared solution was added to the prepared polyamide-acid solution, and then, the mixed solution was Sufficiently stirred for 2 minutes before fully extracting air therefrom. Next, a PET film was coated with the air-extracted solution and then thermally treated at 80° C. for 25 minutes. After stripping off the PET film, the mixed components were thermally treated by way of continuously raising temperature from 150° C. to 200° C., and then further heated for minutes before being imidized, and finally, film-form thermoplastic polyimide was yielded.

As was done for the Example 1, inventors checked the glass transition point (°C.) and the hygroscopic degree (%) of the yielded thermoplastic polyimide film. Furthermore, in order to check adhesive property thereof, a polyimide film "APICAL" (a product and a registered trade name of Kanegafuchi Chemical Industrial Co., Ltd.), the yielded thermoplastic polyimide film, and an exfoliatable paper, were superposed before being laminated together at 150° C. and 2.2 cm/min. of speed to produce a polyimide lamination, and further, an exfoliatable paper was exfoliated from the polyimide lamination and instead of the exfoliatable paper, copper foil was applied, and finally, a flexible copper-coated laminated board was completed by being laminated at 150° C. and 2.2 cm/min. of speed. As was done for the Example 1, inventors checked the peeling strength (kg/cm) of the completed flexible copper-coated laminated board. The test results are also shown in Table 1.

EXAMPLE 4

Except for the use of 13.3 grams of 1,3-bis (4-aminophenoxy)-2,2-dimethyl propane in place of BABPP, in the same way as was done for the Example 3, film-form thermoplastic polyimide was yielded for the Example 4. Furthermore, as was done for the Example 3, after manufacturing a polyimide laminate, a flexible copper-coated laminate was eventually yielded. In the same way as was done for the Example 1, inventors checked the glass transition point, the hygroscopic degree, and the peeling strength of the yielded thermoplastic polyimide film and flexible copper-coated laminate. The test results are shown in Table 1.

EXAMPLE 5

Polyamide-acid polymer solution was yielded by the effect of copolymerization which was executed by adding 30 ml of DMF, 22.7 grams of BABPP, and 10.6 grams of PMDA, to the polyamide-acid polymer solution yielded via the Example 3. As was done for the Example 3, the yielded polyamide-acid polymer solution was imidized before making up a polyimide laminate, and finally, a flexible copper-coated laminated board was completed. In the same way as was done for the Example 1, inventors checked the glass transition point, the hygroscopic degree, and the peeling strength of the manufactured thermoplastic polyimide film and flexible copper-coated laminated board. The test results are shown in Table 1.

EXAMPLE 6

Initially, 1.0 gram of PMDA and 10.0 grams of DMF were respectively sampled in a 50 ml-capacity female flask, which were then sufficiently stirred with a stirrer until fully being dissolved. Independently, 23.3 grams of BABPP and 50.0 grams of DMF were sampled in a 500 ml-capacity three-necked flask equipped with a stirrer, which were then :stirred while replacing atmosphere in the flask with nitrogen until fully being dissolved. Next, 9.9 grams of PMDA was sampled in a 100 ml-capacity eggplant flask, which was then added to the prepared BABPP solution as of solid form. Next, residual PMDA adhered to the wall surface of the 100 ml-capacity eggplant flask was dissolved with 19.8 grams of DMF and then put in the 500 ml-capacity three-necked flask. After aging the mixed solution for about an hour while continuously stirring it, the PMDA solution prepared in the 50 ml-capacity female flask was gradually transferred to the three-necked flask while paying attention to the viscosity of the solution stored in the three-necked flask. After reaching the maximum viscosity, the supply of the PMDA solution was terminated. After aging the mixed solution for an hour while continuously stirring it, polyamide-acid polymer solution was eventually yielded.

Next, a PET film was superficially coated with the yielded polyamide-acid polymer solution, and then the coated solution was thermally treated at 80° C. for 25 minutes. Then, the thermally treated polyamide-acid polymer content was stripped off from the PET film and then secured toga metallic supporter, which was then sequentially heated at 150° C., 200° C., 250° C., and 300° C., for 5 minutes each to implement imidation, and finally, thermoplastic polyimide film was yielded. Next, the thermoplastic polyimide polymer films yielded from the above processes were superposed on both surfaces of a polyimide film before being laminated therewith at 300° C. and 2.2 cm/min. of speed. Finally a polyimide laminate was completed.

As was done for the Example 1, inventors checked the glass transition point and the hygroscopic degree of the yielded polyimide laminate. Furthermore, in order to check the adhesive property of the polyimide laminate, copper foils each having 35 μm of thickness were superposed on both surfaces of the yielded polyimide laminate and then laminated together at 300° C. and 2.2 cm/min. of speed before completing a flexible copper-coated laminated board. As was done for the Example 1, inventors checked the peeling strength of the completed flexible copper-coated laminated board. The test results are also shown in Table 1.

In addition, inventors also tested all the flexible copper-coated laminated boards yielded from the above-described Examples 1 through 6 to check their resistivity to radioactive rays via irradiation of 5 MGy using electronic cables having 2 MeV of capacity. In consequence, neither discoloration of any of the laminated films nor degradation of used material was generated.

Comparative Example 1

Initially, 1.94 gram of 3,3'4,4'-benzophenone tetracarboxylic dianhydride (hereinafter merely referred to as BTDA) and 30.0 grams of DMF were sampled in a 50 ml-capacity female flask and then fully dissolved therein. Independently, 51.8 grams of BAPP and 310.0 grams of DMF were sampled in a 500 ml-capacity three-necked flask equipped with a stirrer. While cooling off the three-necked flask with ice water and replacing atmosphere of this flask with nitrogen, sampled chemicals were stirred well until fully being dissolved. Independently, 38.8 grams of BTDA was sampled in a 100 ml-capacity eggplant flask, which was then added to the BAPP solution as of solid form. Next, residual BTDA adhered to the wall surface of the 100 ml-capacity eggplant flask was fluidly transferred to the 500 ml-capacity three-necked flask via the aid of 10.0 grams of DMF. After aging the mixed solution stored in the three-necked flask for about an hour while continuously stirring it, while paying attention to the viscosity of the mixed solution in the three-necked flask, the BTDA solution stored in the 50 ml-capacity female flask was gradually put in the three-necked flask. After reaching the maximum viscosity, the supply of the BTDA solution was terminated, and then the mixed solution in the, three-necked flask was aged for an hour while continuously being stirred. Next, DMF was further added to the mixed solution until the total amount of the :sample reached 500 grams. After stirring the mixed solution, polyamide-acid polymer solution was yielded.

Next, a polyimide film (a product of Kanegafuchi Chemical Industrial Co., Ltd. ) was superficially coated with the yielded polyamide acid polymer solution and then thermally treated at 80° C. for 25 minutes. Next, the polyamide-acid polymer coated polyimide film was sequentially heated at 150° C., 200° C., 250° C., and 300° C., for 5 minutes each to implement imidation, and finally, a polyimide laminate incorporating thermoplastic polyimide polymer layers was yielded.

As was done for the Example 1, inventors checked the glass transition point (°C.) and the hygroscopic degree (%) of thermoplastic polyimide polymer of the yielded polyimide laminate. In order to check the adhesive property of the polyimide laminate, a copper foil having 35 μm of thickness was superposed on the surface of thermoplastic polyimide polymer layer of the yielded polyimide laminate before being laminated at 300° C. and 2.2 cm/min. of speed. Nevertheless, the copper foil did not adhere to the surface of thermoplastic polyimide polymer layer. This result is expressed in Table 1. On the other hand, as a result of the testing resistivity of the polyimide laminate against radioactive rays by irradiating 5 MGy via 2 MeV electronic cables, it was proved that neither discoloration of laminated film nor degradation of used material was generated.

Comparative Example 2

Using the polyimide laminate yielded from the Comparative Example 1, lamination Was effected between the polyimide laminate and copper foils under a condition different from the Comparative Example 1. Concretely, as a result of the lamination executed at 300° C. and 0.3 cm/min. of slow speed, copper foils adhered to the thermoplastic polyimide polymer layers, and thus, flexible copper-coated laminated boards were yielded.

As was done for the Example 1, inventors checked the peeling strength of the yielded flexible copper-coated laminated boards. As shown in Table 1, the peeling strength of the laminated boards was rated to be 0.3 kg/cm, thus failing to achieve sufficient strength.

Comparative Example 3

In place of the inventive thermoplastic polyimide polymer substantially serving as adhesive agent, using a conventional epoxy adhesive agent "EPICOAT" 828 (a product of Yuka-Shell Co., Ltd.), lamination was executed at 150° C. and 2.2 cm/min. of speed as was done for the Example 3 before eventually yielding a flexible copper-coated laminated board.

As a result of checking the physical properties of the yielded flexible copper-coated laminated board as per the method executed for the Example 1, the above-cited epoxy adhesive agent exhibited 178° C. of glass transition point and 1.98% of hygroscopic degree. As was done for the Example 1, inventors also checked the peeling strength of the yielded flexible copper-coated laminated board. Nevertheless, since the copper foil failed to adhere itself to the thermoplastic polyimide polymer layers, the peeling strength was not measurable. This result is expressed in Table 1. As a result of the testing resistivity of the yielded flexible copper-coated laminated board via irradiation of 5 MGy radioactive rays with 2 MeV electronic cables, it was found that the laminated film turned into black.

Industrial Applicability of the Invention

As is evident from the above description, by virtue of utilization of novel thermoplastic polyimide polymer expressed by the above-identified general formula (1), the invention securely materializes the distinctive thermal resistant property and adhesive property of the resultant flexible printed circuit boards. The inventive thermoplastic polyimide polymer is ideally usable for sufficing adhesive-agent layer needed for manufacturing flexible printed circuit boards. Actually, because of poor thermal resistant property, any of those conventional epoxy adhesive agents thus far being used for manufacturing flexible printed circuit boards failed to activate distinctive thermal resistant property of polyimide film serving as a base film. On the other hand, in order to properly effect adhesion, any of those conventional adhesive agents composed of conventional thermoplastic polyimide polymers obliges manufacturers to execute heating and compressing processes for a long duration with pressurizing means, thus resulting in extremely poor productivity, low adhesion, and failure to achieve sufficient adhesive strength of processed objects.

On the other hand, since the novel polyimide film consisting of the inventive thermoplastic polyimide polymer expressed by the above-identified general formula (1) is not only quite distinctive in terms of thermal resistant property and adhesive strength, but it also provides adhesion with Sufficient strength merely by executing a short-period pressurizing process, and accordingly, the inventive polyimide film serving as a novel adhesive agent securely enables manufacturers to properly manufacture flexible copper-coated laminated boards with improved productivity.

Furthermore, the novel polyimide laminate comprising thermoplastic polyimide polymer layers being laminated on both surfaces or on a single surface of a nonthermoplastic polyimide film can serve as a bilateral or single-side adhesive sheet, and yet, it can also be used for the base film of a cover-lay film having adhesive-agent layer and a flexible copper-coated laminated board. The inventive polyimide laminate can properly be perforated via an alkaline etching process, and thus, when being used as a cover-lay film, after completing the adhesion of the polyimide laminate to the surface of circuits formed on a flexible printed circuit board, perforation can easily be executed, thus making it possible for manufacturers to significantly improve operating efficiency for adhesion of a cover-lay film.

Furthermore, since the inventive thermoplastic polyimide polymer characteristically exhibits extremely low hygroscopic degree, the inventive thermoplastic polyimide film formed from this polymer is ideally suited not only for serving as an adhesive-agent film, but also for serving as the base film or a cover-lay film of a flexible printed circuit board.

In particular, the inventive thermoplastic polyimide polymer represented by the above-identified general formula (1) has proved to be distinctively resistant to radioactive rays, and accordingly, such flexible printed circuit boards made from the inventive thermoplastic polyimide polymer are effectively usable for those apparatuses potentially being affected by radioactive rays.

What is claimed is:

1. Thermoplastic polyimide film comprising a thermoplastic polyimide polymer which is represented by the general formula (1) specified below:

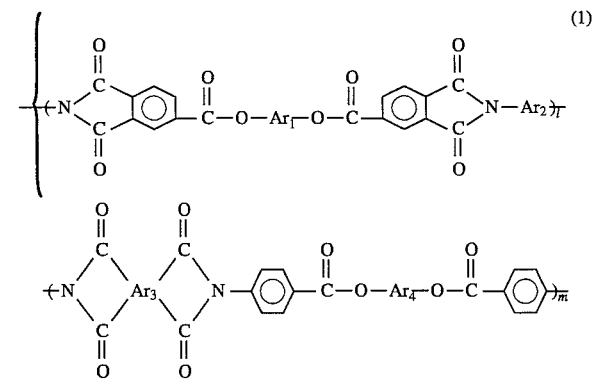

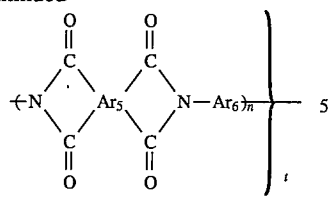

where $Ar_1$, $Ar_2$, $Ar_4$, and $Ar_6$, respectively represent divalent organic radical; $Ar_3$ and $Ar_5$ respectively represent quadrivalent organic radical; l, m, and n, respectively designate a positive integer of 0 to 15; and the sum of l and m is one or more than one; and t represents positive integer of one or more than one.

2. The thermoplastic polyimide film as defined in claim 1, wherein said $Ar_1$ specified in said general formula (1) is at least one kind selected from a group of divalent organic radicals shown in the constitutional formula specified below:

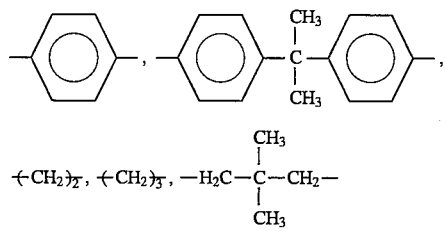

3. The thermoplastic polyimide film as defined in claim 1 or 2, wherein said $Ar_2$ specified in said general formula (1) is at least one kind selected from a group of divalent aromatic radicals shown in the constitutional formulas specified below:

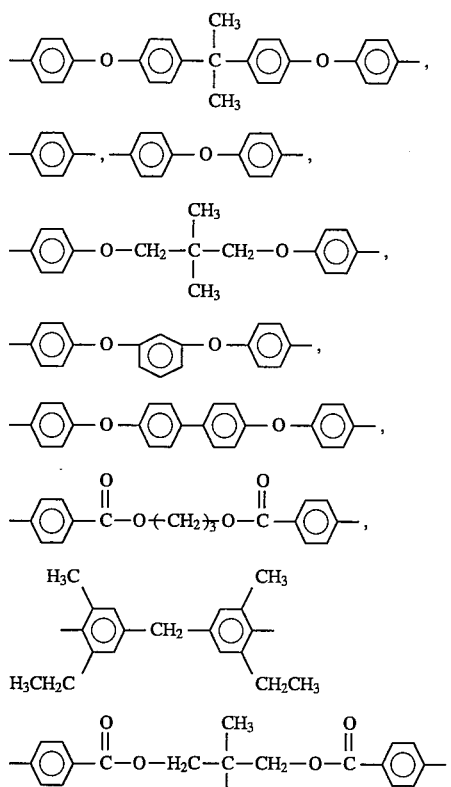

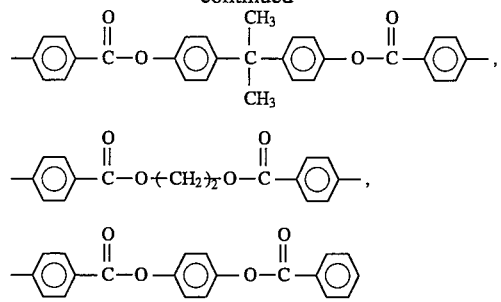

4. The thermoplastic polyimide film as defined in any of the preceding claims 1 or 2, wherein said $Ar_3$ specified in said general formula (1) is at least one kind selected from a group of quadrivalent aromatic radicals shown in the constitutional formulas specified below:

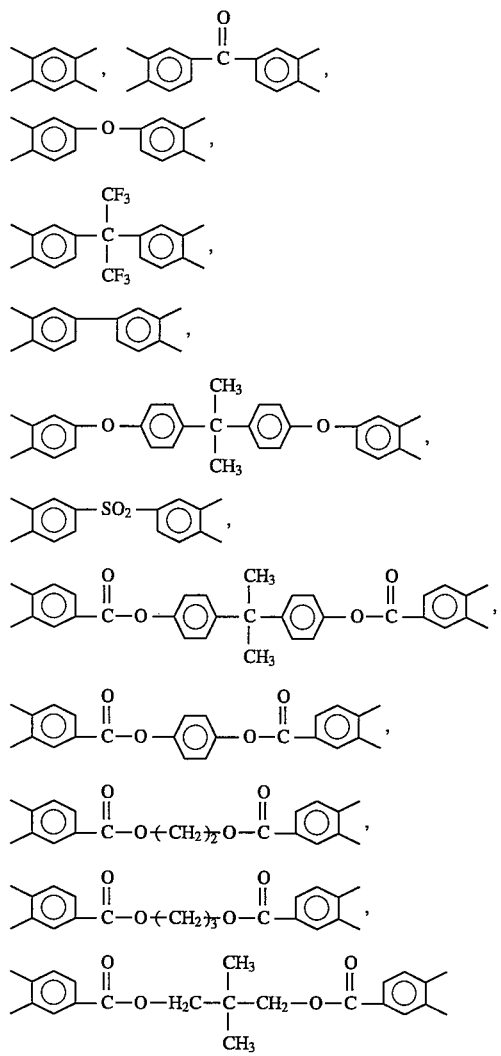

5. The thermoplastic polyimide film as defined in any of the preceding claims 1 or 2, wherein said $Ar_4$ specified in said general formula (1) is at least one kind selected from a group of divalent organic radicals shown in thee constitutional formulas specified below:

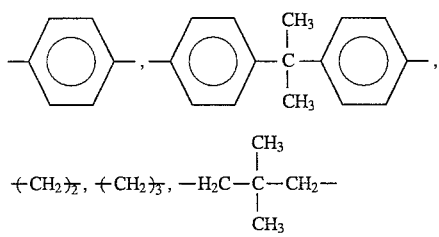

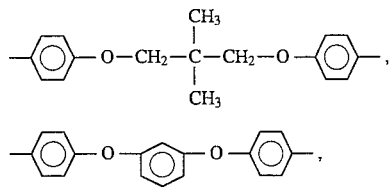

6. The thermoplastic polyimide film as defined in any of the preceding claims 1 or 2, wherein said $Ar_5$ specified in said general formula (1) is at least one kind selected from a group of quadrivalent aromatic radicals shown in the constitutional formulas specified below:

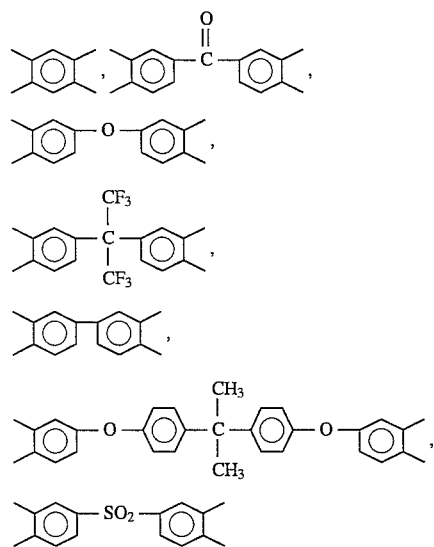

7. The thermoplastic polyimide film as defined in any of the preceding claims 1 or 2, wherein said $Ar_6$ specified in said general formula (1) is at least one kind selected from a group of divalent aromatic radicals shown in the constitutional formulas specified below:

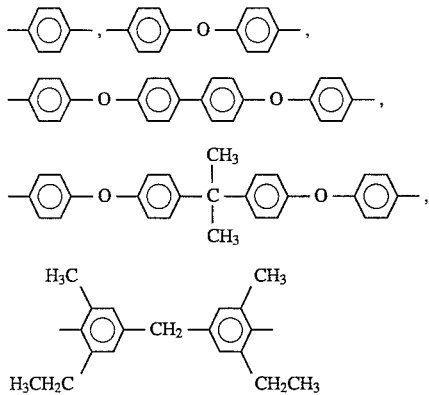

8. Polyimide laminate comprising layers of the thermoplastic polyimide film defined in any of the preceding claims 1 or 2, wherein said layers are laminated by way of superposition on an exfoliatable film.

9. An adhesive sheet comprising of layers of thermoplastic polyimide film defined in any of the preceding claims 1 or 2, wherein said layers are laminated by way of superposition on both surfaces or a single surface of a nonthermoplastic polyimide film.

10. Polyimide laminate comprising;
a base film layer composed of nonthermoplastic polyimide polymer;
adhesive-agent layers composed of thermoplastic polyimide polymer specified in any of the preceding claims 1 or 2; and
a conductive layer composed of electrically conductive material.

11. A method of manufacturing polyimide laminate comprising sequential steps including the following;
a step to coat a base-film layer composed of nonthermoplastic polyimide polymer with the solution of precursor of thermoplastic polyimide polymer specified in any of the preceding claims 1 or 2;
a step to dry said solution-coated base-film layer;
a step to imidize said solution coated base-film layer;
a step to superpose a conductive layer on yielded thermoplastic polyimide layers; and
a final step to adherently laminate said layers via a thermal pressing process.

12. A method of manufacturing polyimide laminate comprising sequential steps including the following;
a step to sequentially superpose a film composed of thermoplastic polyimide polymer specified in any of the preceding claims 1 or 2 and a conductive layer on a base film composed of nonthermoplastic polyimide polymer; and
a final step to adherently laminate said film and said conductive layer in conjunction with said base film by executing a thermal pressing process.

* * * * *